United States Patent
Zhao et al.

(10) Patent No.: US 7,566,591 B2
(45) Date of Patent: Jul. 28, 2009

(54) METHOD AND SYSTEM FOR SECURE HEAT SINK ATTACHMENT ON SEMICONDUCTOR DEVICES WITH MACROSCOPIC UNEVEN SURFACE FEATURES

(75) Inventors: Sam Z. Zhao, Irvine, CA (US); Reza-ur R. Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 423 days.

(21) Appl. No.: 11/261,662

(22) Filed: Oct. 31, 2005

(65) Prior Publication Data
US 2007/0040267 A1     Feb. 22, 2007

Related U.S. Application Data

(60) Provisional application No. 60/709,813, filed on Aug. 22, 2005.

(51) Int. Cl.
*H01L 21/00* (2006.01)
(52) U.S. Cl. ............... 438/122; 438/106; 438/107; 438/108; 438/126; 257/E21.499; 257/E21.514
(58) Field of Classification Search ......... 257/E21.499, 257/E21.514; 438/106–126
See application file for complete search history.

(56) References Cited

U.S. PATENT DOCUMENTS

| | | | | |
|---|---|---|---|---|
| 5,672,548 | A * | 9/1997 | Culnane et al. | 438/118 |
| 5,745,344 | A * | 4/1998 | Baska et al. | 361/705 |
| 5,770,478 | A * | 6/1998 | Iruvanti et al. | 438/122 |
| 5,777,847 | A * | 7/1998 | Tokuno et al. | 361/705 |
| 6,043,110 | A * | 3/2000 | Davis et al. | 438/118 |
| 6,117,797 | A * | 9/2000 | Hembree | 438/759 |
| 6,333,551 | B1 * | 12/2001 | Caletka et al. | 257/707 |
| 6,444,496 | B1 * | 9/2002 | Edwards et al. | 438/122 |
| 6,590,292 | B1 * | 7/2003 | Barber et al. | 257/778 |
| 6,617,682 | B1 * | 9/2003 | Ma et al. | 257/706 |
| 6,825,108 | B2 | 11/2004 | Khan et al. | |
| 6,848,912 | B2 | 2/2005 | Zhang | |
| 6,853,070 | B2 | 2/2005 | Khan et al. | |
| 6,861,750 | B2 | 3/2005 | Zhao et al. | |
| 6,875,638 | B2 * | 4/2005 | Yoneda et al. | 438/125 |
| 6,876,553 | B2 | 4/2005 | Zhao et al. | |
| 6,879,039 | B2 | 4/2005 | Khan et al. | |
| 6,882,041 | B1 * | 4/2005 | Cheah et al. | 257/704 |
| 6,882,042 | B2 | 4/2005 | Zhao et al. | |
| 6,887,741 | B2 | 5/2005 | Zhao et al. | |
| 6,906,414 | B2 | 6/2005 | Zhao et al. | |
| 6,965,171 | B1 * | 11/2005 | Lee et al. | 257/783 |
| 6,967,403 | B2 * | 11/2005 | Chuang et al. | 257/717 |
| 6,989,593 | B2 | 1/2006 | Khan et al. | |
| 7,005,323 | B2 * | 2/2006 | Ogasawara et al. | 438/108 |

(Continued)

OTHER PUBLICATIONS

"TC100U Gap Filler Thermal Interface Materials," Saint-Gobain Performance Plastics Corporation, 2004, 1 page.

*Primary Examiner*—Charles D. Garber
*Assistant Examiner*—Abdulfattah Mustapha
(74) *Attorney, Agent, or Firm*—Sterne, Kessler, Goldstein & Fox, PLLC.

(57) ABSTRACT

Methods, systems, and apparatuses for attaching heat sinks to integrated circuit packages using thermally conductive adhesive materials are described. The adhesive materials can be shaped to conform to surfaces of the integrated circuit package and/or heat sink, prior to hardening, such as by curing the adhesive material.

15 Claims, 19 Drawing Sheets

U.S. PATENT DOCUMENTS

| | | | |
|---|---|---|---|
| 7,005,737 B2 | 2/2006 | Zhao et al. | |
| 7,038,312 B2 | 5/2006 | Khan et al. | |
| 7,078,806 B2 | 7/2006 | Khan et al. | |
| 7,094,060 B2 | 8/2006 | Zhang | |
| 7,102,225 B2 | 9/2006 | Khan et al. | |
| 7,132,744 B2 | 11/2006 | Zhao et al. | |
| 7,161,239 B2 | 1/2007 | Zhao et al. | |
| 7,163,840 B2 * | 1/2007 | Chen et al. | 438/108 |
| 7,168,957 B2 | 1/2007 | Zhang | |
| 7,196,415 B2 | 3/2007 | Zhong et al. | |
| 7,202,559 B2 | 4/2007 | Zhao et al. | |
| 7,224,057 B2 * | 5/2007 | Yang | 257/707 |
| 7,227,256 B2 | 6/2007 | Zhao et al. | |
| 7,241,645 B2 | 7/2007 | Zhao et al. | |
| 7,245,500 B2 | 7/2007 | Khan et al. | |
| 7,259,448 B2 | 8/2007 | Zhang et al. | |
| 7,259,457 B2 | 8/2007 | Zhang et al. | |
| 7,262,079 B2 * | 8/2007 | Xie | 438/108 |
| 7,271,479 B2 | 9/2007 | Zhao et al. | |
| 7,312,108 B2 | 12/2007 | Zhao et al. | |
| 7,326,061 B2 | 2/2008 | Zhang | |
| 7,402,906 B2 | 7/2008 | Rahman et al. | |
| 7,405,145 B2 | 7/2008 | Khan et al. | |
| 7,411,281 B2 | 8/2008 | Zhang | |
| 7,432,586 B2 | 10/2008 | Zhao et al. | |
| 7,462,933 B2 | 12/2008 | Zhao et al. | |
| 7,482,686 B2 | 1/2009 | Zhao et al. | |
| 2002/0079572 A1 | 6/2002 | Khan et al. | |
| 2002/0190361 A1 | 12/2002 | Zhao et al. | |
| 2003/0146509 A1 | 8/2003 | Zhao et al. | |
| 2005/0029657 A1 | 2/2005 | Khan et al. | |
| 2005/0035452 A1 | 2/2005 | Zhang et al. | |
| 2005/0077545 A1 | 4/2005 | Zhao et al. | |
| 2006/0065972 A1 | 3/2006 | Khan et al. | |
| 2006/0091542 A1 | 5/2006 | Zhao et al. | |
| 2007/0045824 A1 | 3/2007 | Zhao et al. | |
| 2007/0090502 A1 | 4/2007 | Zhao et al. | |
| 2007/0108598 A1 | 5/2007 | Zhong et al. | |
| 2007/0267740 A1 | 11/2007 | Khan et al. | |
| 2008/0006934 A1 | 1/2008 | Zhao et al. | |
| 2008/0182364 A1 | 7/2008 | Zhang | |

* cited by examiner

METHOD AND SYSTEM FOR SECURE HEAT SINK ATTACHMENT ON SEMICONDUCTOR DEVICES WITH MACROSCOPIC UNEVEN SURFACE FEATURES

This application claims the benefit of U.S. Provisional Application No. 60/709,813, filed Aug. 22, 2005, which is incorporated herein by reference in its entirety.

BACKGROUND OF THE INVENTION

1. Field of the Invention

The invention relates generally to the field of integrated circuit (IC) device packaging technology and, more particularly to heat sink attachment in IC device packages.

2. Background Art

IC semiconductor dies are typically mounted in or on a package that is attached to a printed circuit board (PCB). Example IC device packages include ball grid array (BGA), pin grid array (PGA), and land grid array (LGA) packages. A conventional BGA package has an array of solder balls located on a bottom external surface of a package substrate. The solder balls are reflowed to attach the package to the PCB. The IC die is typically mounted to a top surface of the package substrate. Wire bonds typically couple signals of the IC die to the substrate. The substrate has internal routing that electrically couples the signals of the IC die to the solder balls on the bottom substrate surface. A molding compound encapsulates the IC die, wire bonds, and the entire or partial top surface of the substrate to provide environmental protection.

Die-up and die-down BGA package configurations exist. In die-up BGA packages, the IC die is mounted on the top surface of the substrate, so that the active surface of the IC die is directed away from the PCB. In die-down BGA packages, the IC die is mounted on the bottom surface of the substrate, so that the active surface of the IC die is directed towards the PCB.

Problems with conventional IC packages include poor thermal performance. IC dies can generate a large amount of heat during operation in an IC package. Heat sinks are frequently attached to IC packages to aid in removing the heat from the IC package. However, presently used heat sinks do not make efficient contact with the IC package due to limitations of conventional adhesives, and thus any increase in thermal performance due to heat sinks is still limited.

What is needed is enhanced attachment mechanisms for heat sinks to IC packages, such as BGA packages, that provide enhanced ability to dissipate heat generated by the IC die.

BRIEF SUMMARY OF THE INVENTION

Methods, systems, and apparatuses for attaching heat sinks to integrated circuit packages using thermally conductive adhesive materials are described. The adhesive materials can be shaped to conform to surfaces of the integrated circuit package and/or heat sink, prior to hardening.

In an aspect of the present invention, a heat sink is attached to an integrated circuit package. A deformable adhesive material is applied to a surface. The adhesive material is thermally conductive. The adhesive material is shaped. A surface of the heat sink is applied to a surface of the integrated circuit package. The shaped adhesive material is between the surface of the heat sink to the surface of the integrated circuit package. The adhesive material is cured to adhere the heat sink to the integrated circuit package. The adhesive material provides a thermal path between the heat sink and the integrated circuit package.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
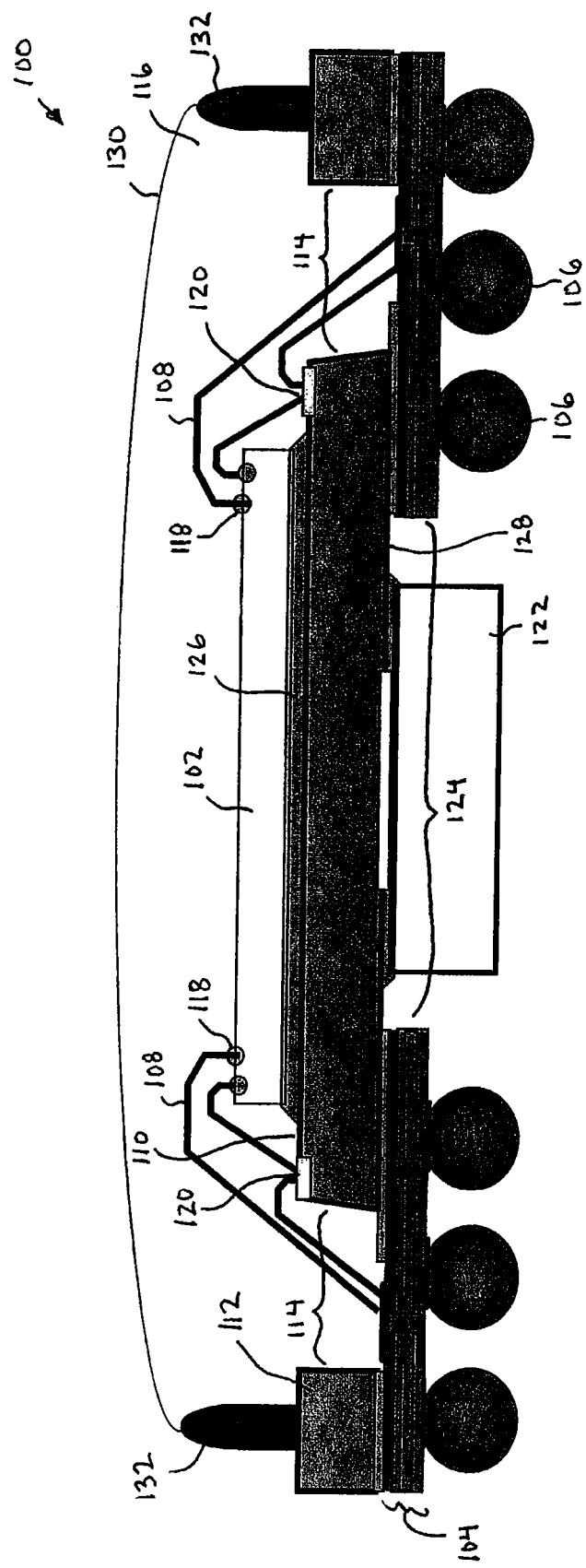
FIG. 1 shows an example ball grid array package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

Example embodiments of the present invention are described herein.

Other structural and operational embodiments will be apparent to persons skilled in the relevant art(s) based on the following discussion. Although described with reference to ball grid array packages for illustrative purposes, embodiments of the present invention are applicable to other integrated circuit package types, including pin grid array (PGA) packages and chip carrier packages.

In embodiments, heat sinks are attached to integrated circuit packages using thermally conductive adhesive materials. The adhesive materials can be shaped to conform to surfaces of the integrated circuit package and/or heat sink, prior to being cured. For example, embodiments of the present allow for the secure attachment of heat sinks on semiconductor devices that have macroscopic uneven surface features, such as due to the presence of capacitors, resistors, inductors, and/or other passive components, and/or one or more exposed dies with various heights, mounted on a substrate of the devices.

The thermally conductive adhesive material is considered "deformable" because it can be shaped, and substantially maintains its shape during or prior to application, providing for greater ease in manufacturing.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above", "below", "up" "down", "top", "bottom", etc.) used herein are for purposes of illustration only, and that practical implementations of the structures described herein can be spatially arranged in any orientation or manner.

EXAMPLE EMBODIMENTS OF THE PRESENT INVENTION

A ball grid array (BGA) package is used to package and interface an IC chip or die with a printed circuit board (PCB). BGA packages may be used with any type of IC die, and are particularly useful for high speed ICs. In a BGA package, solder pads do not just surround the package periphery, as in chip carrier type packages, but cover the entire bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., Ball Grid Array Technology, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

FIG. 1 illustrates a BGA package 100, according to an example embodiment of the present invention. BGA package 100 includes an IC die 102, a substrate 104, a plurality of solder balls 106, one or more wire bonds 108, a stiffener 112, and a thermal connector 122.

Substrate 104 can be any suitable type of integrated circuit substrate, including a tape or flex substrate, a plastic substrate, or a ceramic substrate. Tape or flex BGA packages are particularly appropriate for large IC dies with large numbers of input and outputs, such as application specific integrated circuits (ASIC) and microprocessors.

A tape substrate is generally made from one or more conductive layers bonded with a dielectric material. For instance, the dielectric material may be made from various substances, such as polyimide tape. The conductive layers are typically made from a metal, or combination of metals, such as copper and aluminum. Conductive features, such as trace or routing patterns, are made in the conductive layer material. A tape substrate may be a single-layer tape, a two-layer tape, or additional layer tape substrate type. In a two-layer tape, the metal layers sandwich the dielectric layer, such as in a copper-Upilex-copper arrangement.

In an example plastic embodiment, substrate 104 may include one or more metal layers formed on an organic substrate (for example, BT resin or FR4 epoxy/glass).

Stiffener 112 is laminated or otherwise attached to substrate 104. Stiffener 112 can be attached to substrate 104 to add planarity and rigidity to substrate 104, and thus to package 100. Stiffener 112 may be separated from substrate 104 by an electrically isolating material so that stiffener 112 does not short together conductive features on substrate 104. Stiffener 112 is typically made from a metal, or combination of metals, such as copper, tin, and aluminum, or may be made from a polymer, for example. Stiffener 112 also may act as a heat sink, and allow for greater heat spreading in BGA package 100. One or more openings 114 in stiffener 112 may be used to allow for wire bonds 108 to connect IC die 102 to substrate 104. Stiffener 112 may be configured in other ways, and have different opening arrangements than shown in FIG. 1. In other embodiments, stiffener 112 may not be present in BGA package 100, such as when a rigid substrate 104 is present.

In FIG. 1, IC die 102 is attached to a central location on a top surface 110 of stiffener 112. For example, IC die 102 is attached to stiffener 112 by an epoxy 126. IC die 102 can be any type of semiconductor integrated circuit, typically separated from a semiconductor wafer. In an alternative embodiment, IC die 104 can be mounted to substrate 104 through an opening in stiffener 116. In another alternative embodiment, die 104 is mounted to substrate 104 and stiffener 116 is not present in package 100.

One or more wire bonds 108 connect corresponding bond pads 118 on IC die 102 to contact points 120 on substrate 104 through openings 114. For instance, gold bonding wire is bonded from aluminum bond pads on IC die 102 to gold-plated contact pads on substrate 104. The contact pads on substrate 104 are coupled to solder balls 106 attached to the bottom surface of substrate 104, through routing and vias within substrate 104.

An encapsulating material 116, such as an epoxy, mold compound, or other type of encapsulating material, covers IC die 102 and wire bonds 108 for mechanical and environmental protection.

Note that although wire bonds 108 are shown in FIG. 1, IC die 102 may be mounted and coupled to substrate 104 using solder balls located on the bottom surface of IC die 102, by a process commonly referred to as "C4" or "flip chip" packaging. For example, FIG. 3, described in further detail below, shows such a configuration.

BGA package 100 includes an array of solder balls 106 located on a bottom external surface of substrate 104. Solder balls 106 are reflowed to attach BGA package 100 to a PCB (not shown in FIG. 1). The PCB may include contact pads to which solder balls 106 are bonded. PCB contact pads are generally made from a metal or combination of metals, such as copper, nickel, tin, and gold.

The array of solder balls 106 on the bottom surface of substrate 104 surrounds a thermal connector 122. Thermal connector 122 is coupled to a bottom surface 128 of stiffener 112 through an opening 124 in substrate 104. Direct electrical and/or thermal connection from stiffener 112 to the PCB is possible due to thermal connector 122 when package 100 is mounted to the PCB. Thermal connector 122 may be made from a metal, such as copper or aluminum. In an embodiment, thermal connector 122 is made from the same material as stiffener 112. Material different from stiffener 112 may be used for ground/thermal connector 122 to compensate for the mismatch of thermal expansion coefficient between die 102 and stiffener 112. Thermal connector 122 may be laminated to the exposed portion of stiffener 112 using conductive epoxy. The bottom surface of thermal connector 122 may be plated with solder to facilitate its surface mount to soldering pads on the PCB. Metal pads on the PCB may be connected to a PCB ground plane to shorten the length of electrical current return paths, as well as enhance the conductive heat dissipation path from IC die 102 to the PCB. An advantage of this design is a high efficiency in the metal connector lamination process.

As shown in FIG. 1, a dam 132 is attached to stiffener 112. Dam 132 surrounds a central portion of the top of package 100. Encapsulating material 116 is applied to package 100 within dam 132 in a "dam and fill" manner, and subsequently hardens.

As shown in FIG. 1, ball grid array package 100 has a curved (e.g., convex) top surface 130. Top surface 130 is curved due to a surface tension of encapsulating material 116 when it is applied to ball grid array package 100, prior to hardening of encapsulating material 116. Furthermore, top surface 130 of encapsulating material 116 may not be smooth, instead having microscopic imperfections and other features.

Although not shown in FIG. 1, in some ball grid array packages, a top surface of IC die 102 can be exposed through encapsulating material 116 (i.e., is not covered by the encapsulating material). In this manner, the top surface of IC die 102 can be accessed (e.g., for attachment of a heat sink).

Figure 2:
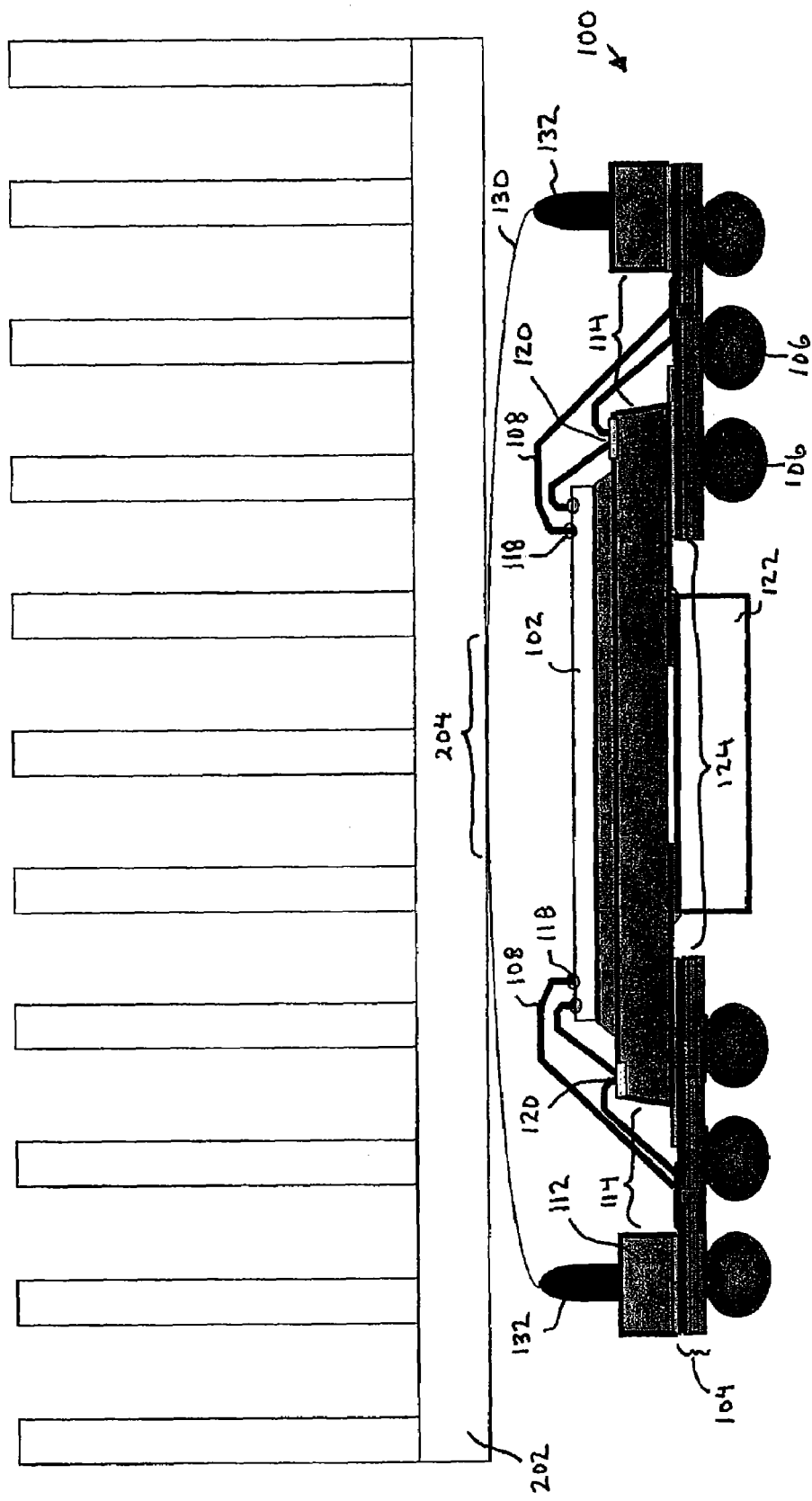
FIG. 2 shows an example heat sink attached to the curved top surface of the ball grid array package of FIG. 1.

FIG. 2 shows an example heat sink 202 attached to curved top surface 130 of ball grid array package 100. Due to the curvature of top surface 130, heat sink 202 does not adhere well to package 100. As shown in FIG. 2, only an area 204 of top surface 130 actually contacts heat sink 202. Due to the small size of area 204, heat transfer from package 100 to heat sink 202 is inefficient.

Figure 3:
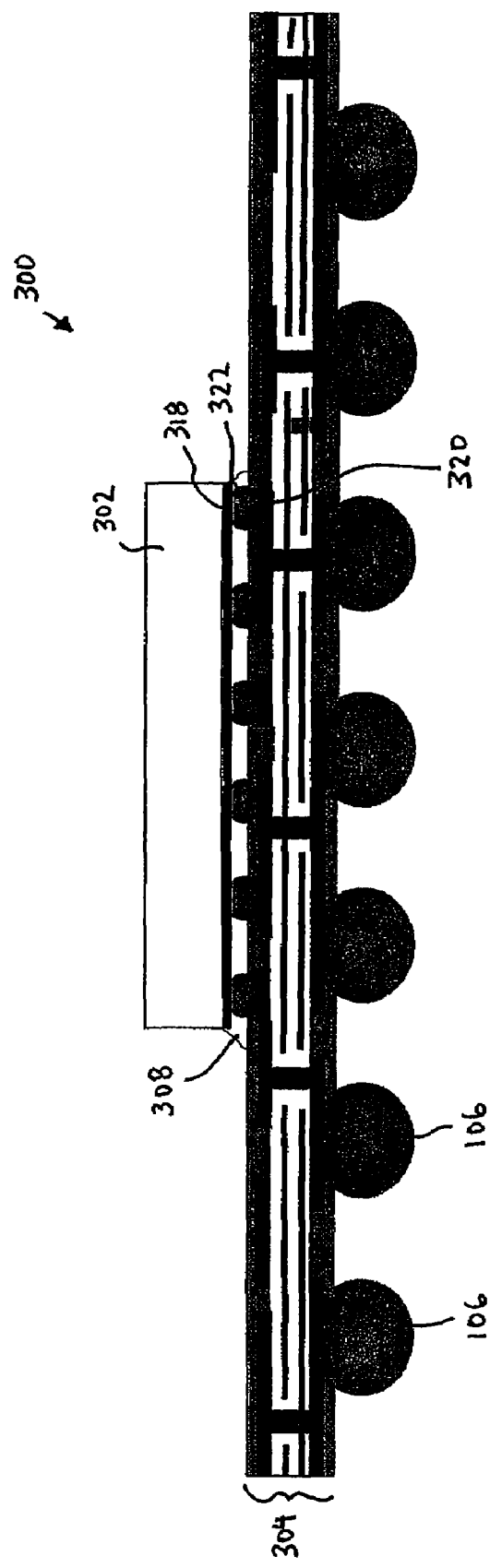
FIG. 3 shows an alternative example ball grid array package having a die configured in a flip-chip orientation.

Ball grid array package 100 uses wire bonds 108 to couple pads 118 of IC die 102 to conductive elements, such as contact points 120 of substrate 104. FIG. 3 shows an alternative ball grid array package 300 arranged in a flip-chip configuration. As shown in FIG. 3, ball grid array package 300 includes a die 302 and a substrate 304. Die 302 is configured in a flip-chip orientation to couple pads 318 of IC die 302 to contact points 320 of substrate 304. Pads 318 are coupled to contact points 320 by solder balls 322. An underfill material 308 is applied to package 300 to fill in the space between IC die 302 and substrate 304, between solder balls 322.

Figure 4:
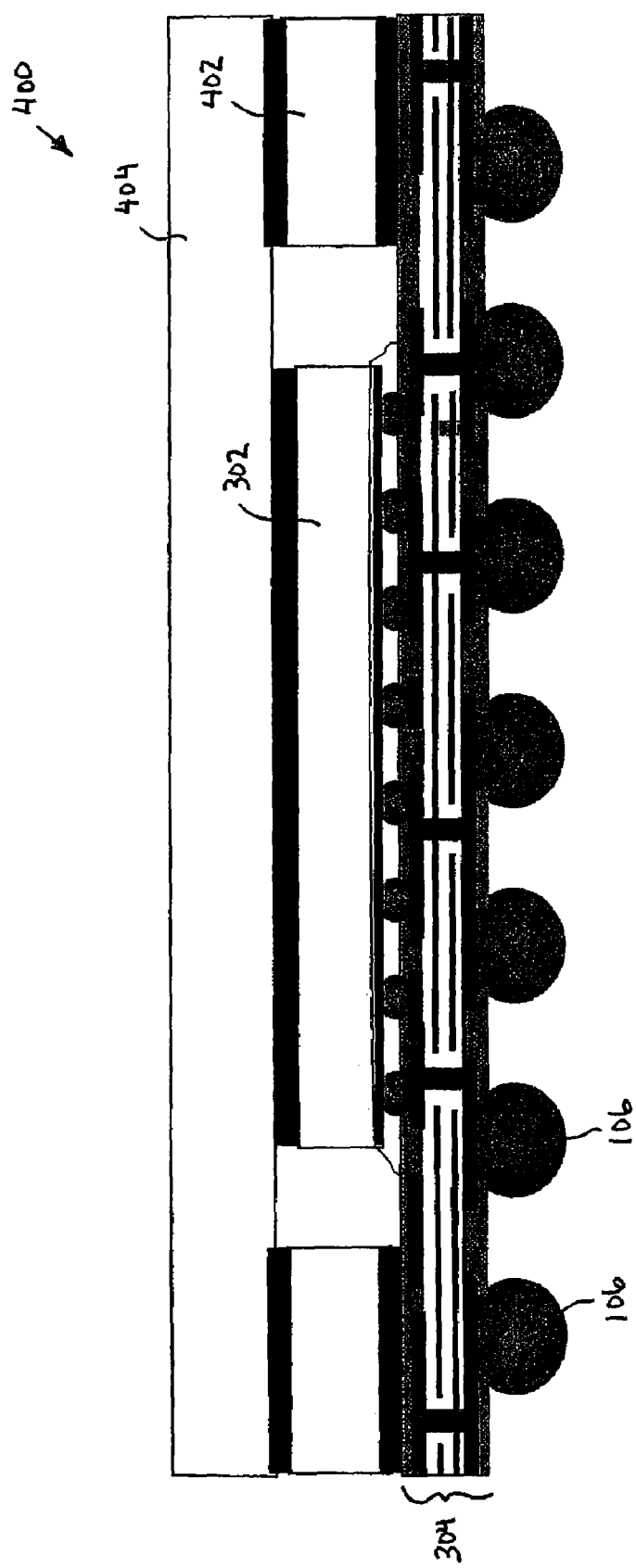
FIG. 4 shows an example ball grid array package having a ring shaped stiffener attached to a substrate of the package, and a planar heat sink/ heat spreader attached to a top surface of the stiffener and flip chip die.

FIG. 4 shows an example ball grid array package 400 having a more complex configuration, including a ring shaped stiffener 402 attached to substrate 304, and a planar heat sink/heat spreader 404 attached to a top surface of ring shaped stiffener 402 and IC die 302. Ring shaped stiffener 402 is present to support heat sink/heat spreader 404, but adds complexity and expense to package 400.

Figure 5:
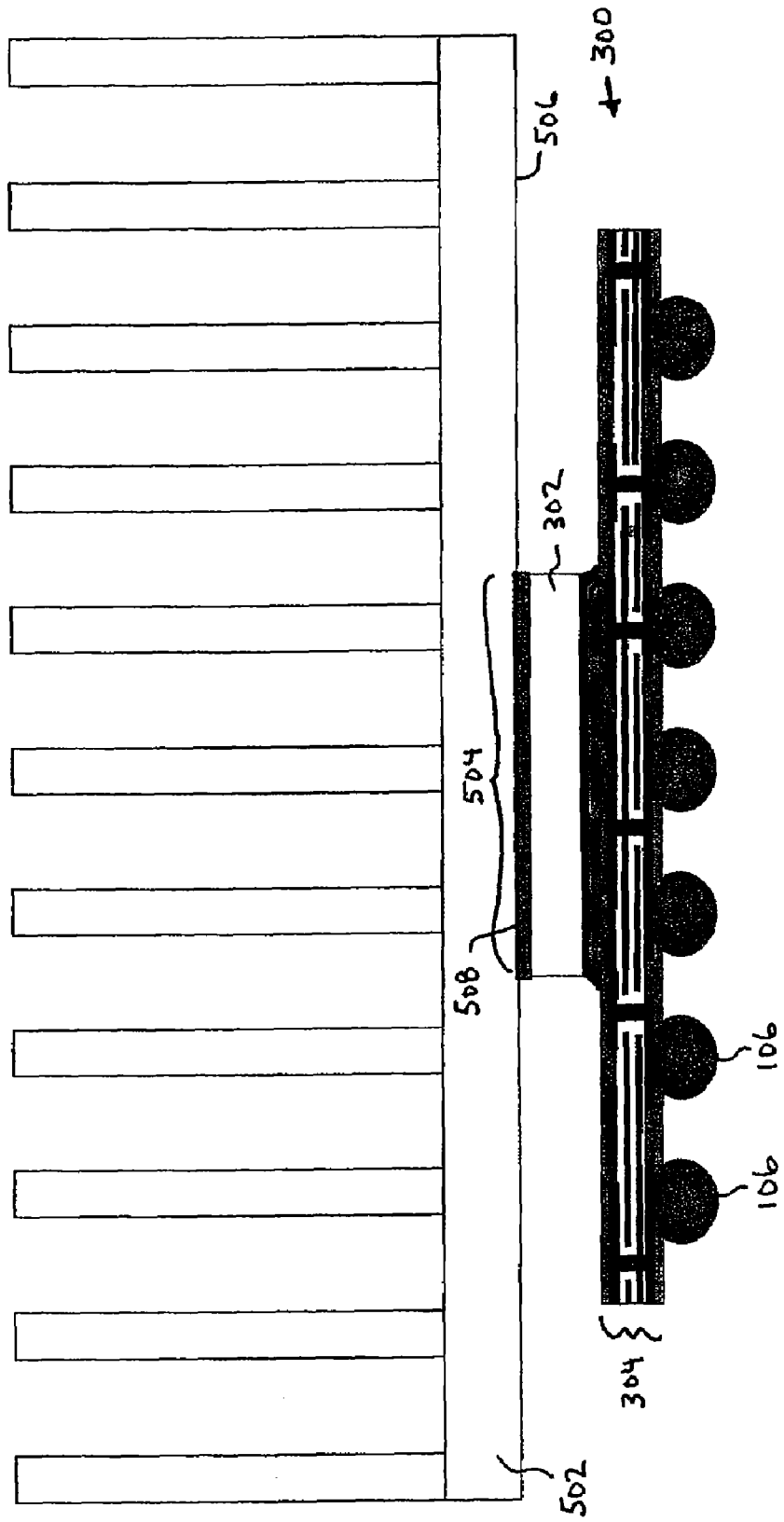
FIG. 5 shows a heat sink attached to a top surface of an integrated circuit die of an integrated circuit package.

FIG. 5 shows a heat sink 502 attached to a top surface 504 of IC die 302 of package 300 by an adhesive material 508. The attachment of heat sink 502 in FIG. 5 is unstable, due to a small area of surface 504 of IC die 302 attached to a relatively larger surface 506 of heat sink 502. Surface 504 of IC die 302 can have a very small area, including in the range of 3 mm×3 mm to 25 mm×25 mm. In contrast, surface 506 of heat sink 502 may have an area in the range of 19 mm×19 mm to 55 mm×55 mm, which is large compared to area 504 of IC die 302. Thus, support is not present in the configuration of FIG. 5 for the perimeter of heat sink 502 around die 302.

Figure 6:
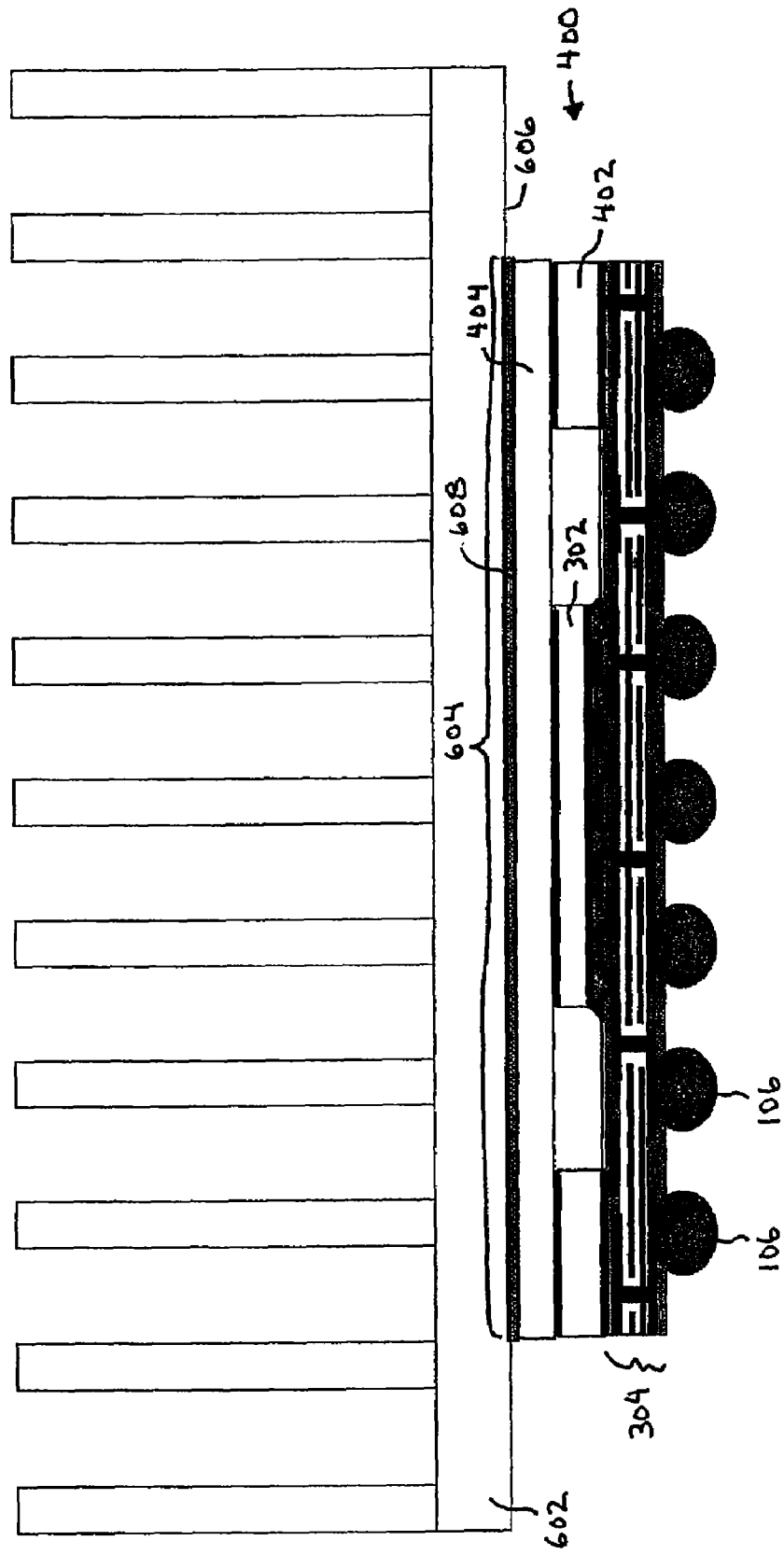
FIG. 6 shows attachment of a heat sink to a ball grid array package similar to that shown in FIG. 4.

FIG. 6 shows attachment of a heat sink 602 to ball grid array package 400 of FIG. 4. A bottom surface 606 of heat sink 602 is attached to a top surface 604 of heat sink/heat spreader 404 by an adhesive material 608. The configuration of FIG. 6 is complex and has many parts, but because surface 604 of heat sink/heat spreader 404 is larger than surface 504 of IC die 302 in FIG. 5, the configuration of FIG. 6 provides better attachment than the configuration of FIG. 5.

Figure 7:
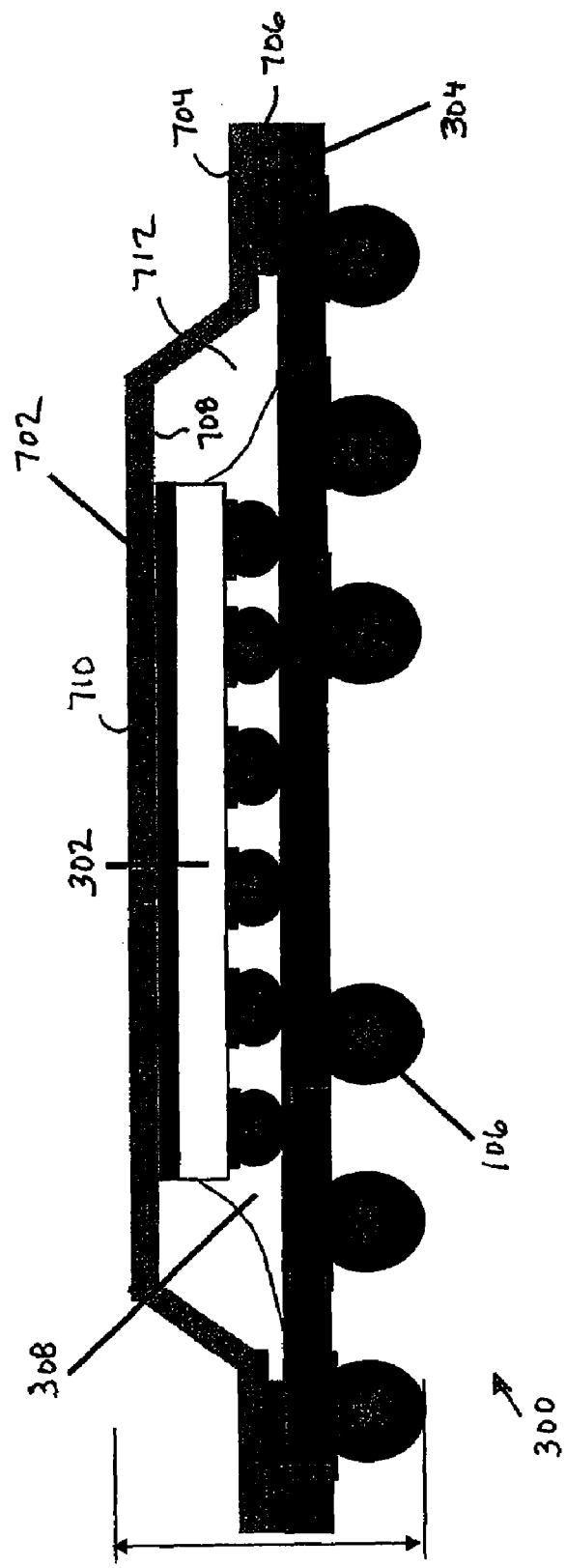
FIG. 7 shows a ball grid array package having a "lid" type of heat sink attached.

FIG. 7 shows ball grid array package 300 having a "lid" type of heat sink 702 attached. Heat sink 702 forms an enclosure 712 with substrate 304 for die 302, for environmental protection. Heat sink 702 is attached at its peripheral rim 704 to the top surface of substrate 304 by an adhesive material 706. An inner lid surface 708 of heat sink 702 is attached to a top surface of die 302 by an adhesive material 710, which may the same as, or different from adhesive material 706. The configuration of FIG. 7 is less complicated than the configuration of FIG. 6. However, in FIG. 7, effective thermal contact is only made with the top surface of IC die 302.

Figure 8:
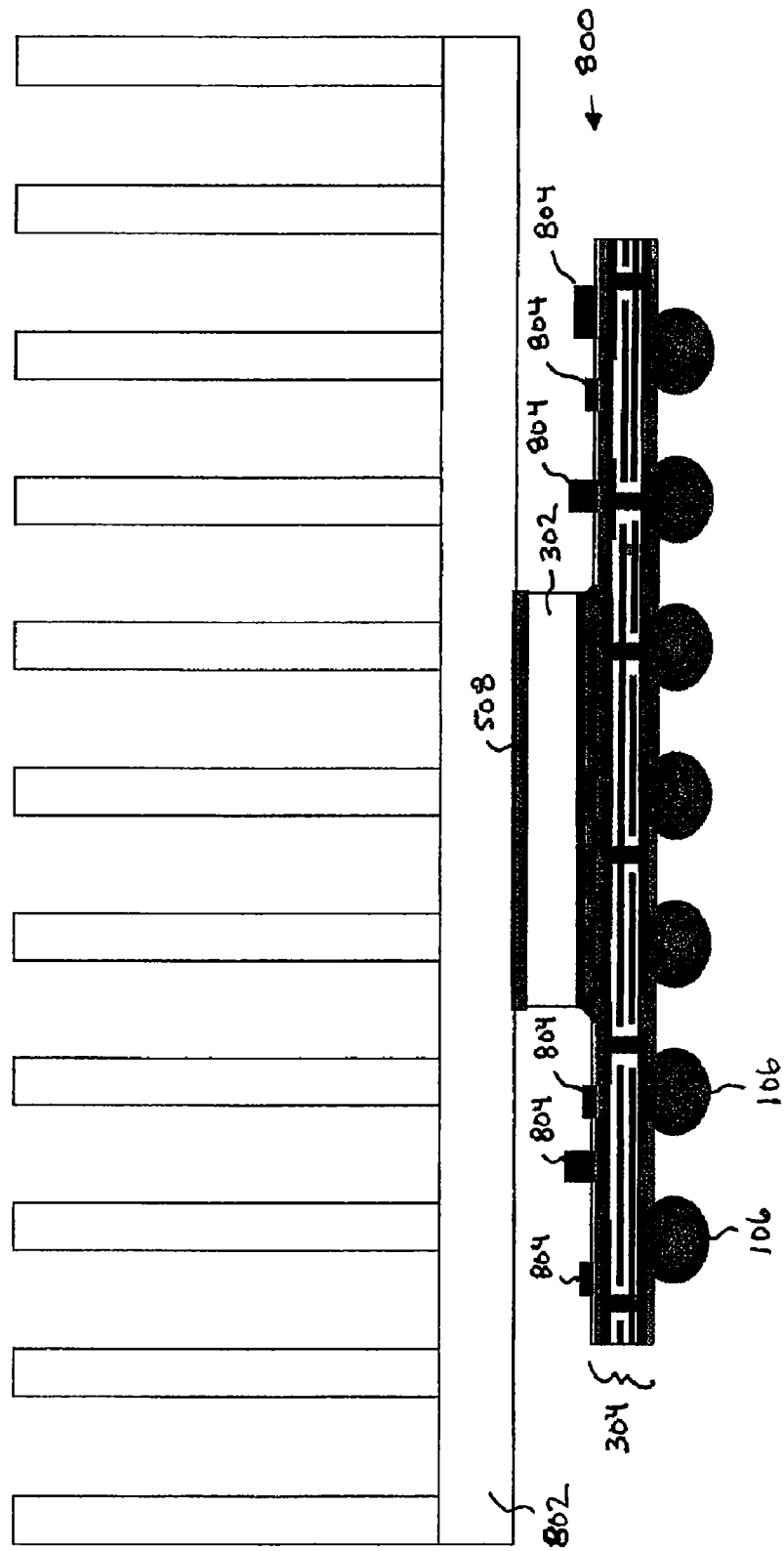
FIG. 8 shows a ball grid array package with heat sink configured similarly to the heat sink and ball grid array package of FIG. 5.

FIG. 8 shows heat sink 802 attached to a ball grid array package 800, similar to the configuration shown in FIG. 5. Furthermore, a plurality of components 804 are mounted to a top surface 802 of substrate 304. Components 804 may be passive components, additional dies, and/or other component types. Package 800 may thus be referred to as a "system in package" (SIP). In some SIPs (although not shown in FIG. 8), components 804 can be thicker than die 302, which may cause difficulty in attaching heat sink 502 to IC die 102. Furthermore, heat generated by components 804 does not have a convenient path to heat sink 502 for dissipation.

Embodiments of the present invention, as further described below, allow for improved coupling of a heat sink to integrated circuit packages, including providing improvements to the configurations described above.

Figure 9:
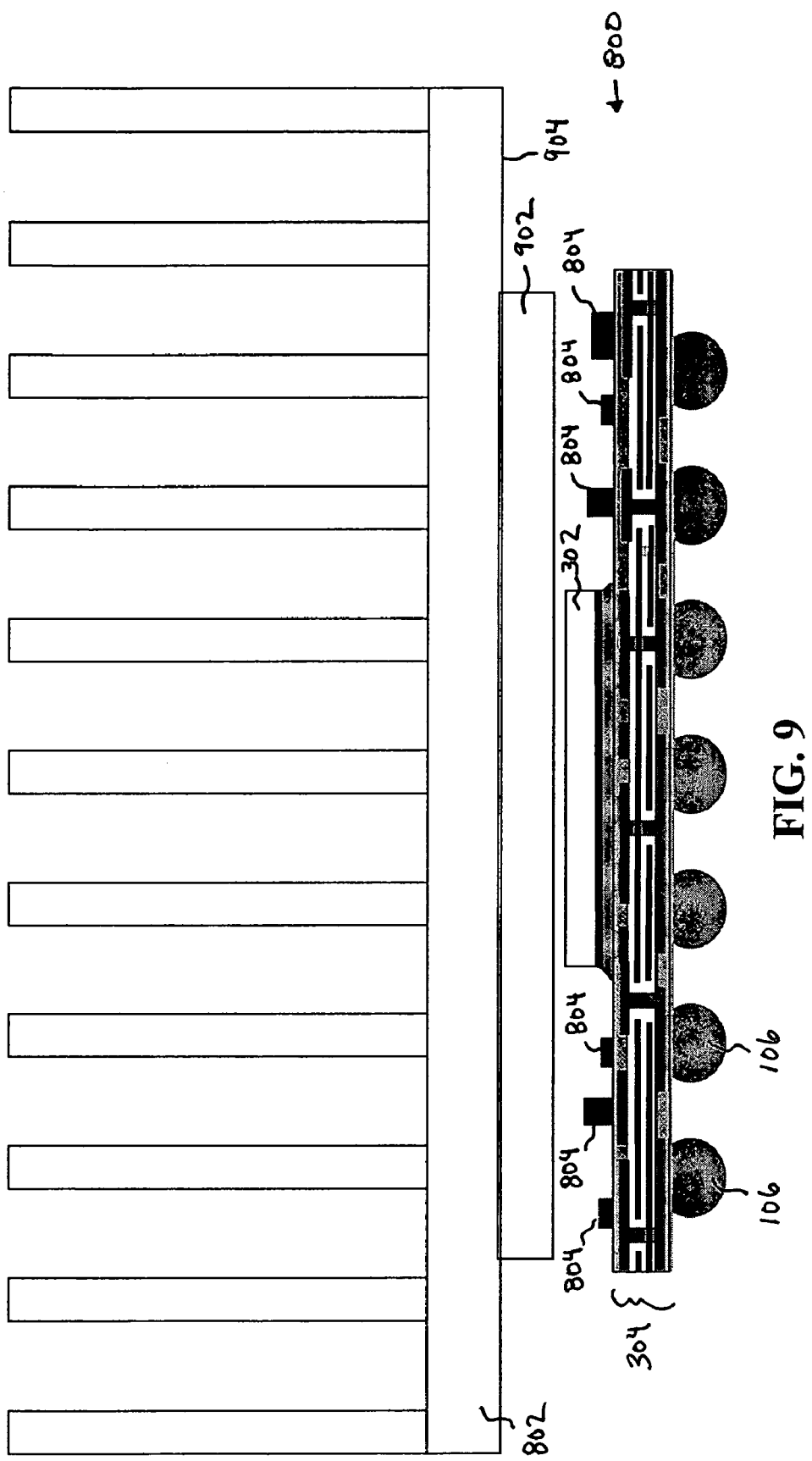
FIG. 9 shows a heat sink in the process of attachment to an integrated circuit package using an improved adhesive material, according to an example embodiment of the present invention.

FIG. 9 shows heat sink 802 in the process of being attached to ball grid array package 800, according to an example embodiment of the present invention. In the embodiment of FIG. 9, an adhesive material 902 is applied to a bottom surface 904 of heat sink 802. Note that in an alternative embodiment, adhesive material 902 may be applied to the top of ball grid array package 800 in addition to applying adhesive material 902 to heat sink 802, or instead of applying adhesive material 902 to heat sink 802.

Adhesive material 902 is thermally conductive. Furthermore, adhesive material 902 is deformable or shapeable. For example, in an embodiment, adhesive material 902 is in a paste or gel form that can be shaped, and maintains the shape. For example, the adhesive material can be a long oligomer paste or gel, or a B-staged polymer, including a silicone material. In an embodiment, the silicone material is TC100U, which is supplied by Saint Gobain Performance Plastics Corporation, of Worcester, Mass.

Figure 10:
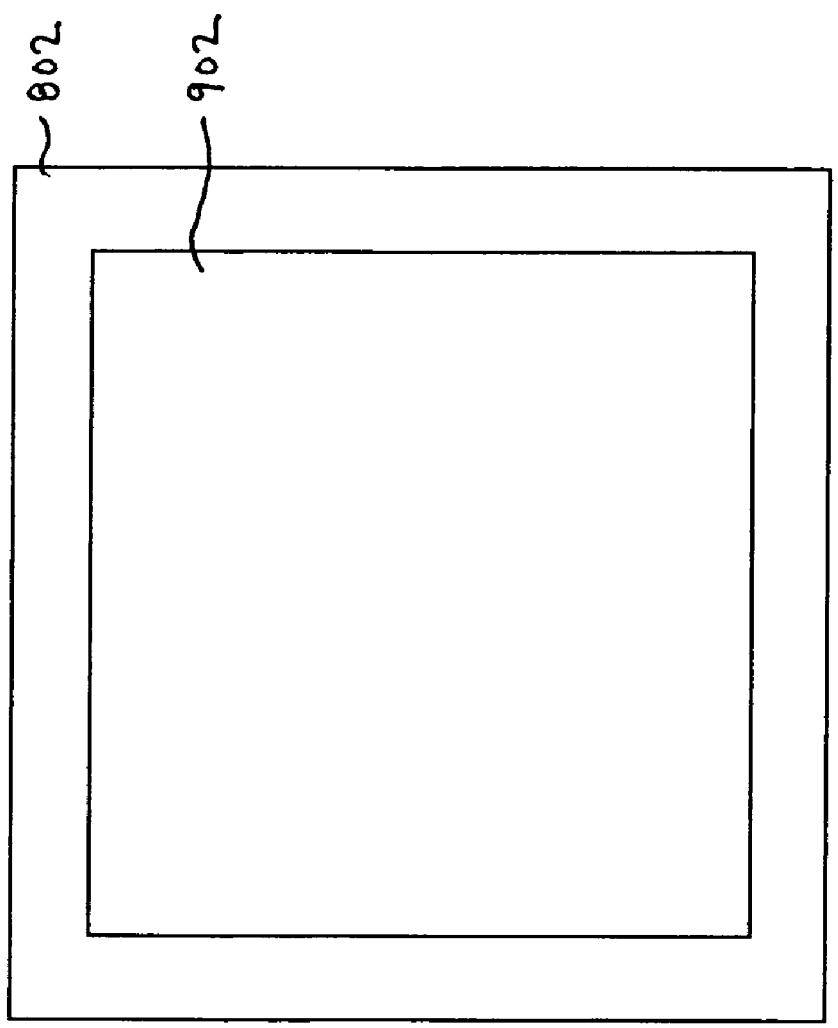
FIGS. 10 and 11 show bottom views of a heat sink having the improved adhesive material thereon.
Figure 11:
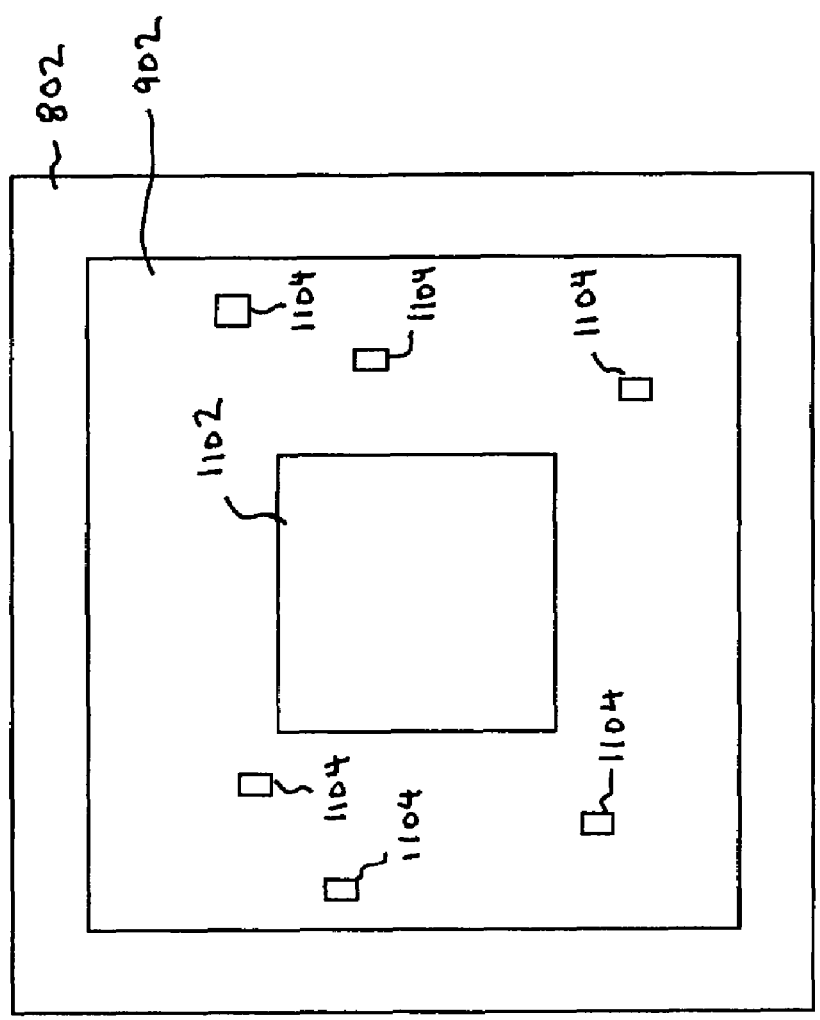

As shown in FIG. 9, adhesive material 902 is shaped. FIG. 10 shows a bottom view of heat sink 802, with adhesive material 902 attached. As shown in FIGS. 9 and 10, adhesive material 902 is shaped into a three-dimensional rectangular shape. In a further embodiment, as shown in FIG. 11, a rectangular cavity or depression 1102 is formed in a central location of adhesive material 902, to accommodate die 302 when heat sink 802 is applied to ball grid array package 800. Thus, adhesive material 902 can be pre-formed in to a rectangular shape, and have a rectangular depression 1102 pre-formed within, that maintain their shape. Furthermore, as shown in FIG. 11, a plurality of further cavities or depressions 1104 can be formed in adhesive material 902 to accommodate other features of ball grid array package 800, such as components 804.

Figure 12:
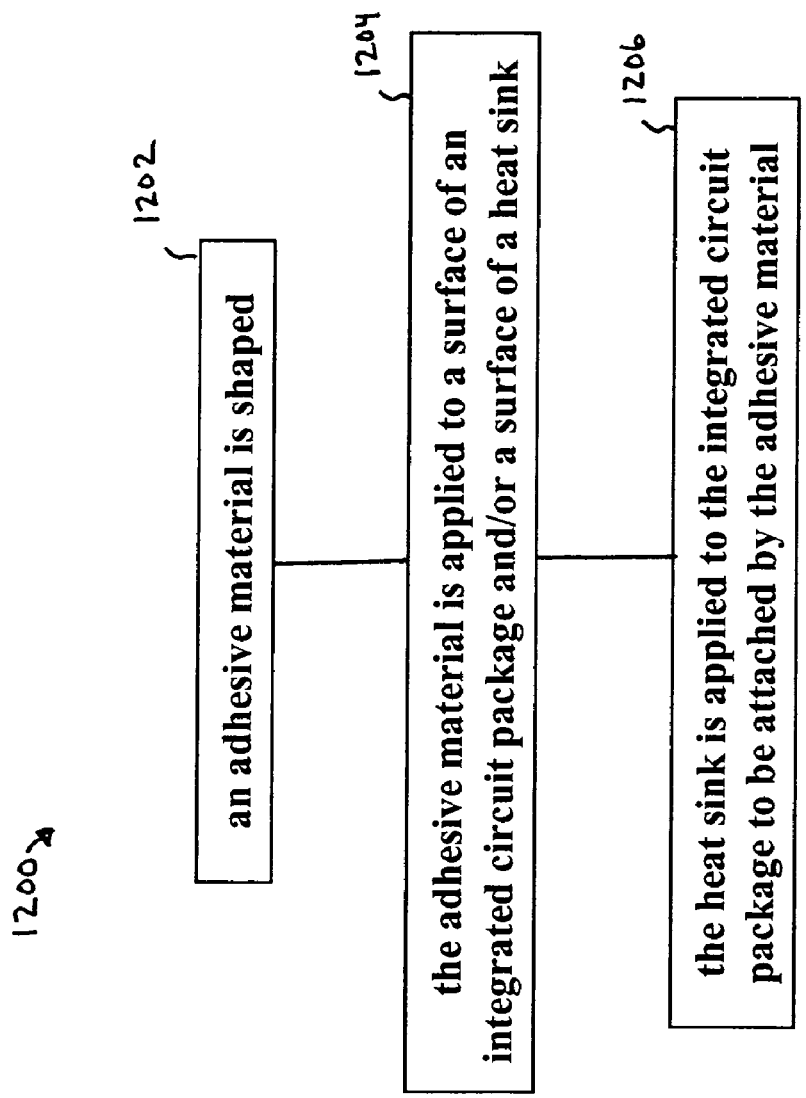
FIG. 12 shows a flowchart for attaching a heat sink to an integrated circuit package, according to an embodiment of the present invention.

FIG. 12 shows a flowchart 1200 providing example steps for attaching a heat sink to an integrated circuit package, according to an embodiment of the present invention. The steps of flowchart 1200 do not necessarily have to occur in the order shown. For example, step 1204 can occur before step 1202. Flowchart 1200 is described in more detail as follows:

Flowchart 1200 begins with step 1202. In step 1202, an adhesive material is shaped. For example, the adhesive material is adhesive material 902 of FIG. 9. As shown in FIGS. 9 and 10, adhesive material 902 can be shaped into a three-dimensional rectangular shape. Alternatively, adhesive material 902 can be shaped into other shapes, including round, elliptical, rounded, triangular, other polygon, etc. Furthermore, as shown in FIG. 10, adhesive material 902 can be shaped to have depressions 1102 and/or 1104, and/or other features. For example, depressions 1104 allow adhesive material 902 to accommodate features of ball grid array package 800 when attached thereto.

Figure 13:
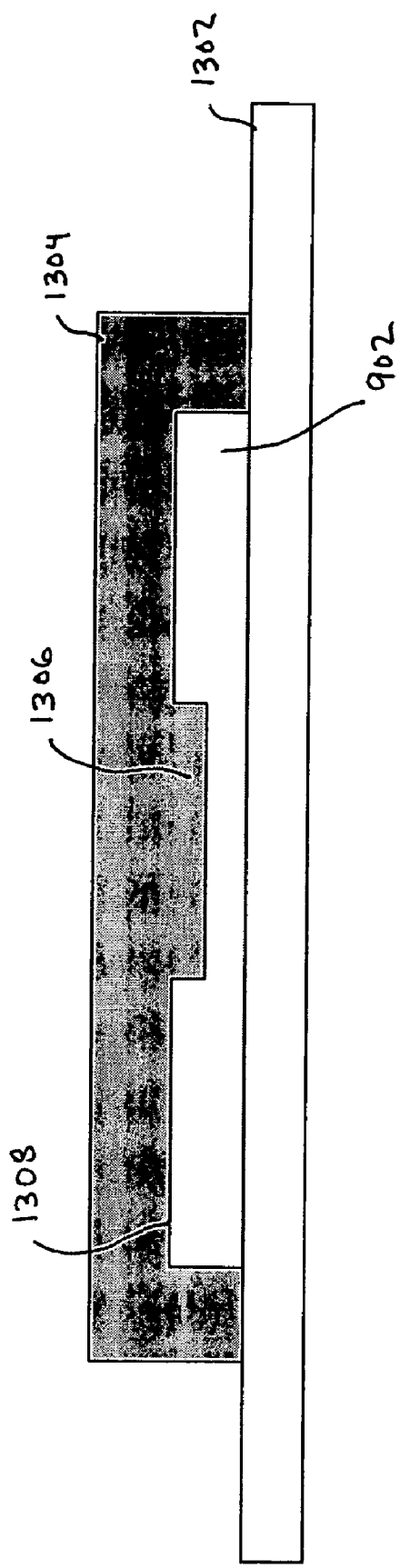
FIG. 13 shows a mold being used to shape the adhesive material, according to an example embodiment of the present invention.

Furthermore, step 1202 can occur prior to step 1204 or after step 1204. For example, in an embodiment, adhesive material 902 is shaped prior to being applied to heat sink 802 (and/or being applied directly to package 800). For example, FIG. 13 shows a cross-sectional view of adhesive material 902 being formed on a surface 1302. Adhesive material 902 can be shaped on surface 1302, such as a tape, from which adhesive material 902 can be subsequently transferred to heat sink 802 or package 800. As shown in FIG. 13, a mold 1304 can be used to shape adhesive material 902 on surface 1302. As shown in FIG. 13, mold 1304 forms adhesive material 902 into a generally rectangular shape, and mold 1304 has a protruding portion 1306 in a cavity 1308 of mold 1304, that is used to form depression 1102 in adhesive material 902. Further protruding portions can be present in mold 1304 to form further depressions in adhesive material 902. Alternatively, protruding portion 1306 can extend from surface 1302 (instead of from mold 1304) to form depression 1102 in the surface of adhesive material 902 adjacent to surface 1302. In an embodiment, adhesive material 902 can be injected into mold 1304 through an opening in mold 1304. Alternatively, adhesive material 902 is in place on surface 1302, and mold 1304 is applied to adhesive material 902 on surface 1302. When mold 1304 is removed, adhesive material 902 can be transferred to heat sink 802 or ball grid array package 800, having the desired shape. Adhesive material 902 can be shaped using other mechanisms, including cutting instruments (e.g., saws, knifes), laser cutting, etc.

In another embodiment, adhesive material 902 is shaped after applying to heat sink 802. Thus, in an embodiment, adhesive material 902 can be shaped while on surface 904 of heat sink 802 (or other surface). Thus, mold 1304 or other shaping mechanism can be applied to adhesive material 902 while on heat sink 802, package 800, etc. In still another embodiment, the adhesive material can be shaped during application to heat sink 802 (or other surface). For example, adhesive material 902 can be printed or applied through a stencil onto surface 904 of heat sink 802 (or other surface).

In step 1204, the adhesive material is applied to a surface of an integrated circuit package and/or a surface of a heat sink. For example, as shown in FIG. 9, adhesive material 902 can be applied to surface 904 of heat sink 802. Alternatively, adhesive material 902 can be applied to a top surface of ball grid array package 800. After application, adhesive material 902 can be shaped, or maintains a shape previously provided to adhesive material 902, including depressions, etc. Note that some shaping of adhesive material 902 can occur during step 1204. For example, depressions can be formed in adhesive material 902 by die 302 and components 804 (when present) during application of adhesive material 902 to package 800.

In step 1206, the heat sink is applied to the integrated circuit package to be attached by the adhesive material. For example, as shown in FIG. 14, heat sink 802 and package 800 are attached together by adhesive material 902.

Note that some shaping of adhesive material 902 can occur during step 1206. For example, if adhesive material 902 is applied to heat sink 802 in step 1204, depressions can be formed in adhesive material 902 by die 302 and components 804 (when present) during application of heat sink 802 to package 800.

Figure 14:
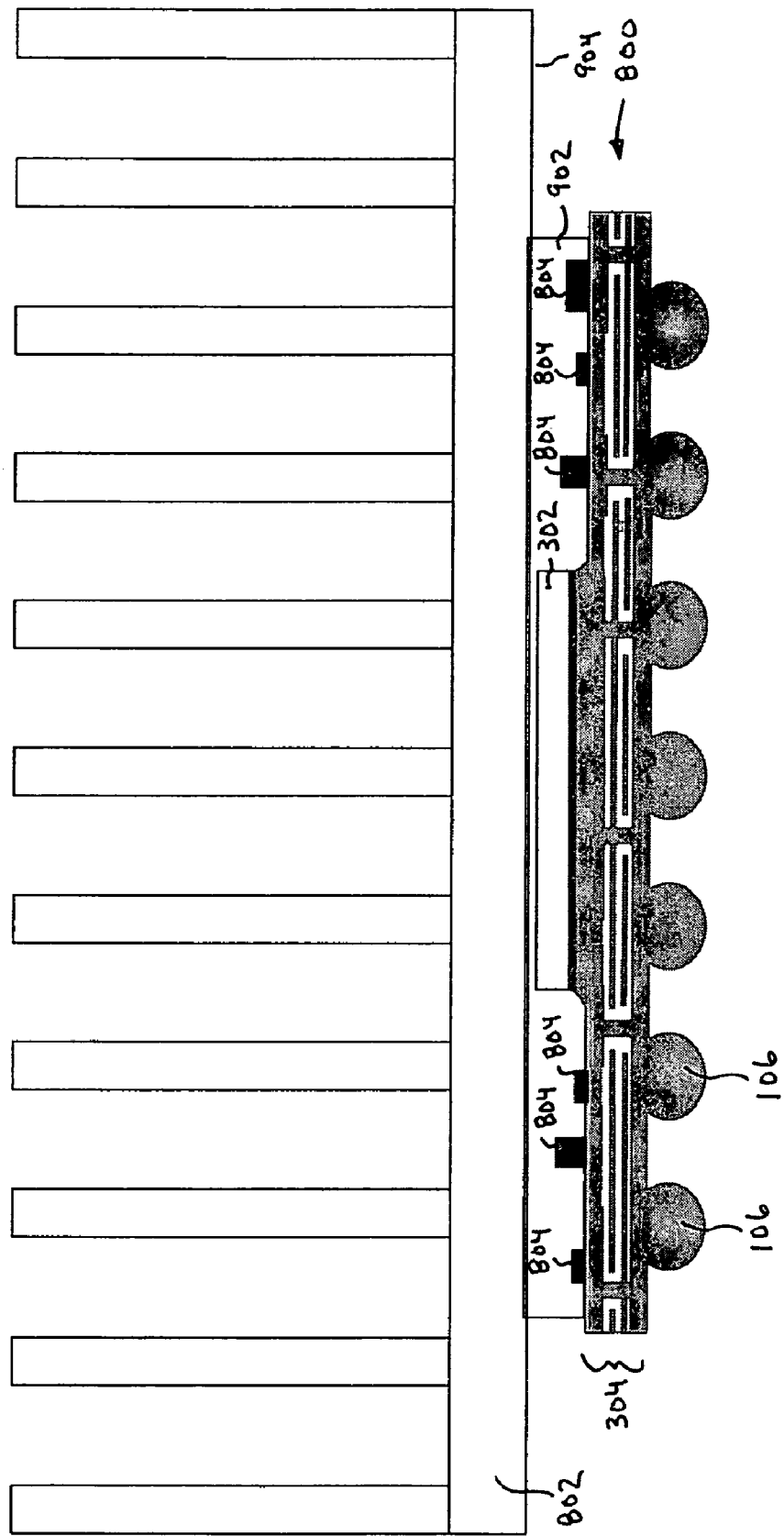
FIG. 14 shows a heat sink attached to an integrated circuit package by an adhesive material, such that a surface of the adhesive material is contacted to a surface of the integrated circuit package.

As shown in FIG. 14, the rectangular shape of adhesive material 902 covers the majority of the top surface of substrate 304 of package 800. Furthermore, adhesive material 902 is deformable, and thus is capable of conforming to the top surface of substrate 304, including conforming to the shape of die 302 and surrounding passive/active components 804.

Adhesive material 902 is cured to adhere surface 904 of heat sink 802 to the surface of ball grid array package 800. Adhesive material 902 accordingly provides a thermal path between heat sink 802 and package 800, including enabling a short thermal path between die 302 and heat sink 802 as shown in FIG. 14. Thus, heat generated by die 302 during operation can be transferred by adhesive material 902 to heat sink 802 to be radiated, or otherwise passed, from package 800. Adhesive material 902 also provides a thermal path from components 804 to heat sink 802. Furthermore, adhesive material 902 environmentally protects die 302 and components 804 (when present). Furthermore, adhesive material 902 provides shock absorption for impacts to heat sink 802. Still further, adhesive material 902 fills macroscopic and microscopic features at its interfaces with heat sink 802 and package 800, to provide better contact. Still further, adhesive material 902 provides a large interfacing surface between heat sink 802 and package 800, as opposed to smaller interfacing surfaces (e.g., surface 204 in FIG. 2, surface 504 in FIG. 5) in other packages, to provide a more stable interconnect. Still further, adhesive material 902 provides for a less complex interface for heat sink 802 and package 800, as opposed to the configurations of FIG. 6. Still further, adhesive material 902 makes contact with a larger surface area of die 302 and package 800, than does a lid-type structure, as shown in FIG. 7.

The adhesive material can be shaped in further ways. For example, when a surface of an integrated circuit package is curved (such as surface 130 in FIG. 1), a surface of adhesive material 902 can be pre-formed to conform to the curved surface of the integrated circuit package, and/or can conform to the curved surface during application to the package.

Figure 15:
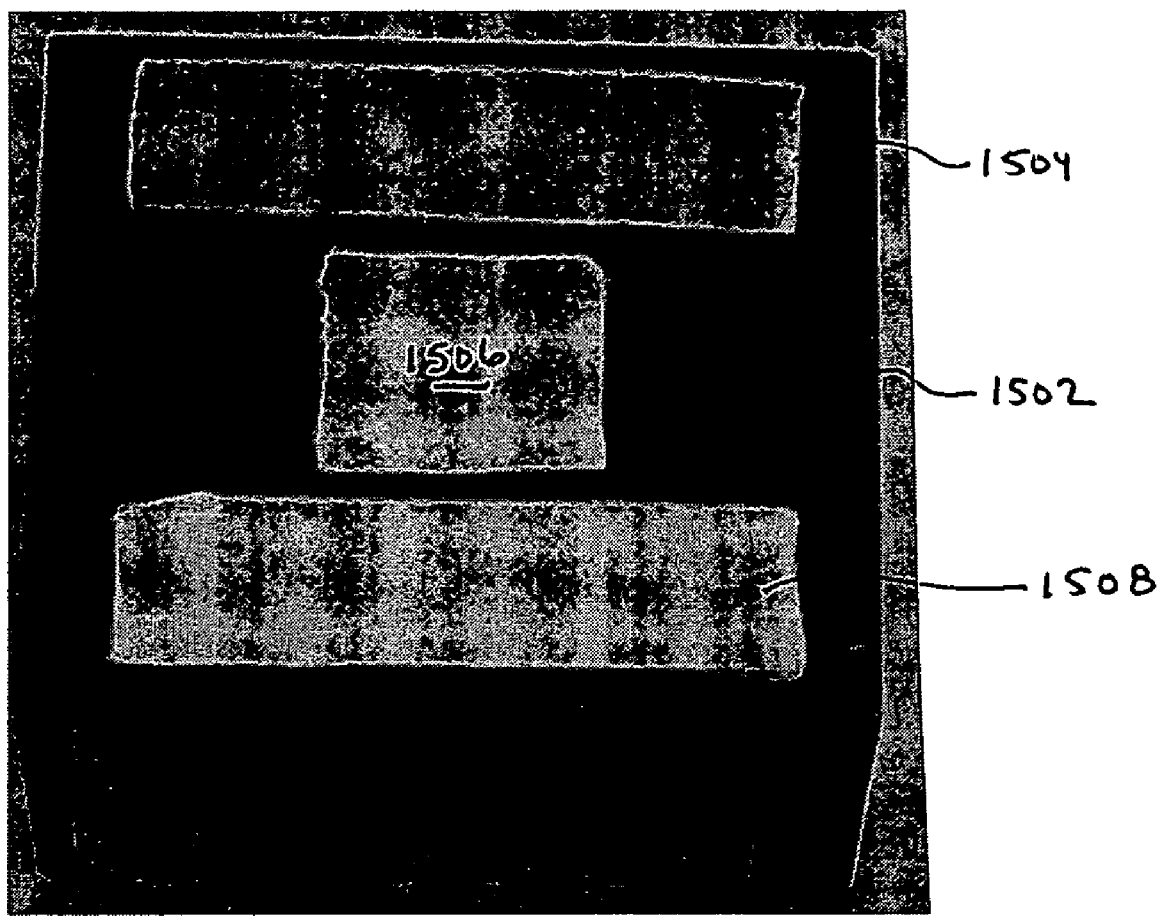
FIGS. 15-19 show views of examples shapes of the adhesive material formed on heat sinks.

FIGS. 15-19 shows photos of examples of shapes of the adhesive material formed on heat sinks. FIG. 15 shows a heat sink 1502 having three portions 1504, 1506, and 1508 of adhesive material 902 formed thereon, in rectangular shapes. Central portion 1506 is used to adhere to a die of a package, and the outer two portions 1504 and 1508 are used to adhere to a substrate of the package.

Figure 16:
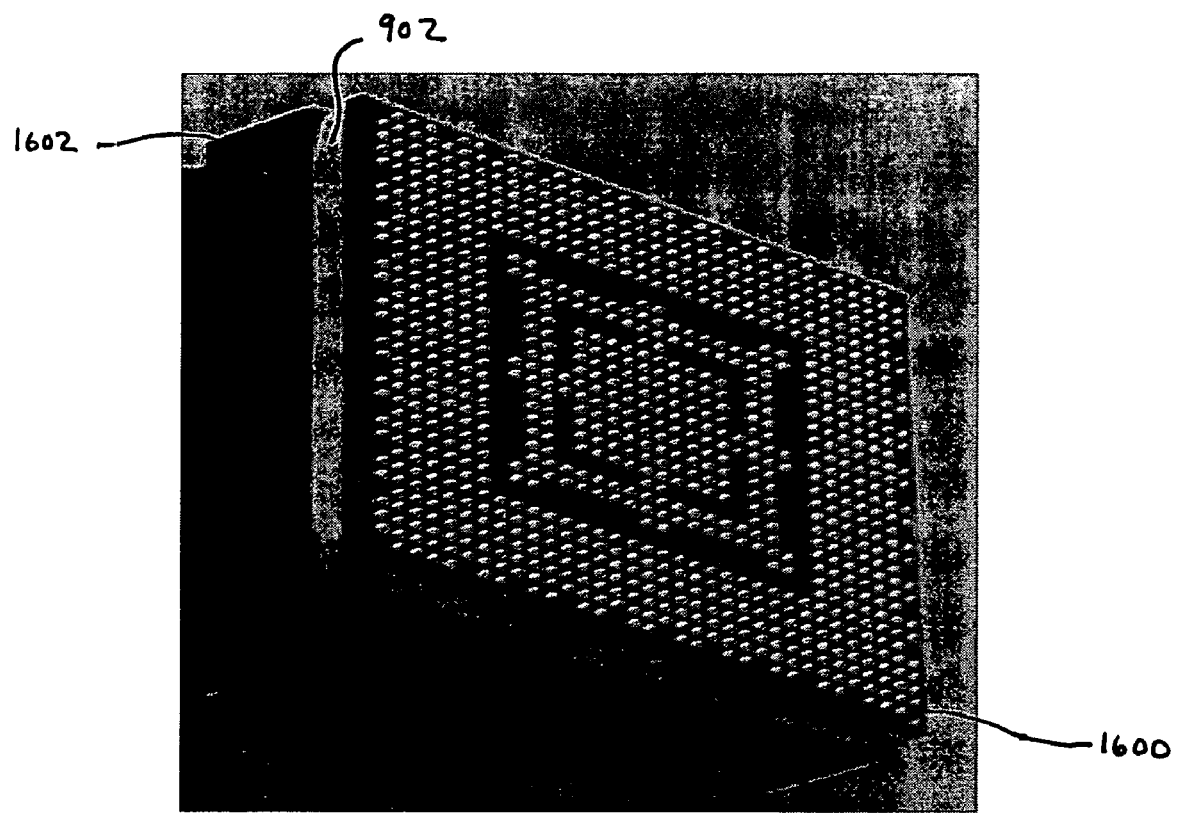

FIG. 16 shows a bottom view of a ball grid array package 1600 having a heat sink 1602 attached to a top surface using adhesive material 902.

Figure 17:
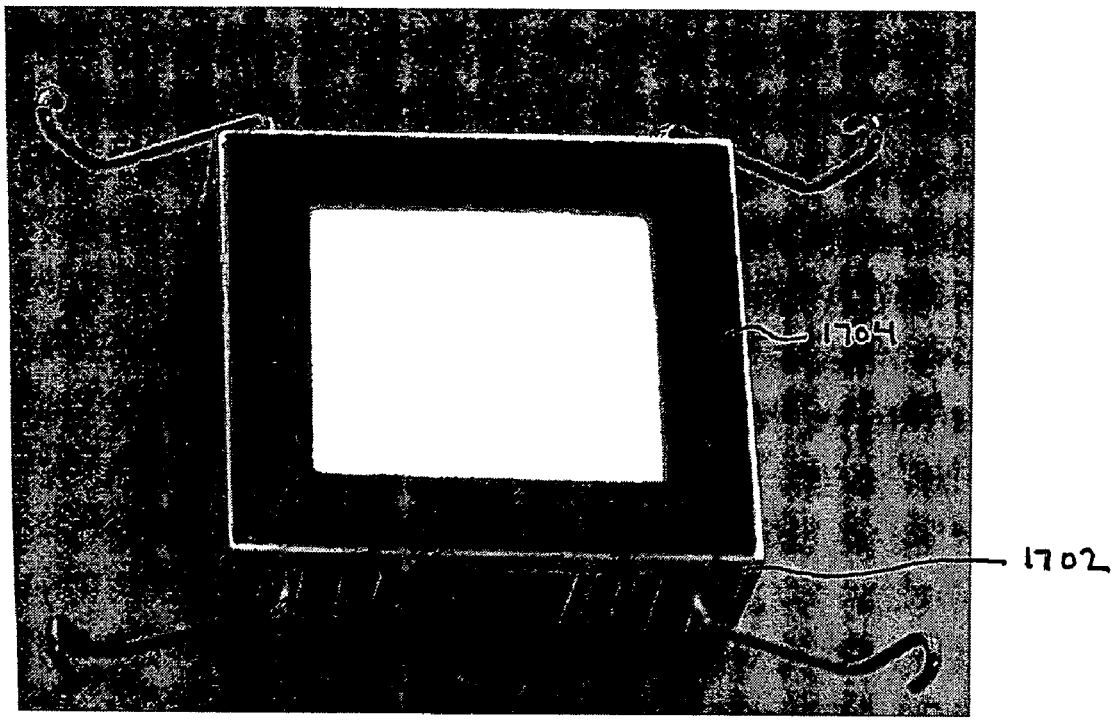

FIG. 17 shows a ring shaped portion 1704 of adhesive material 902 on a heat sink 1702 used to attach heat sink 1702 to an integrated circuit package.

Figure 18:
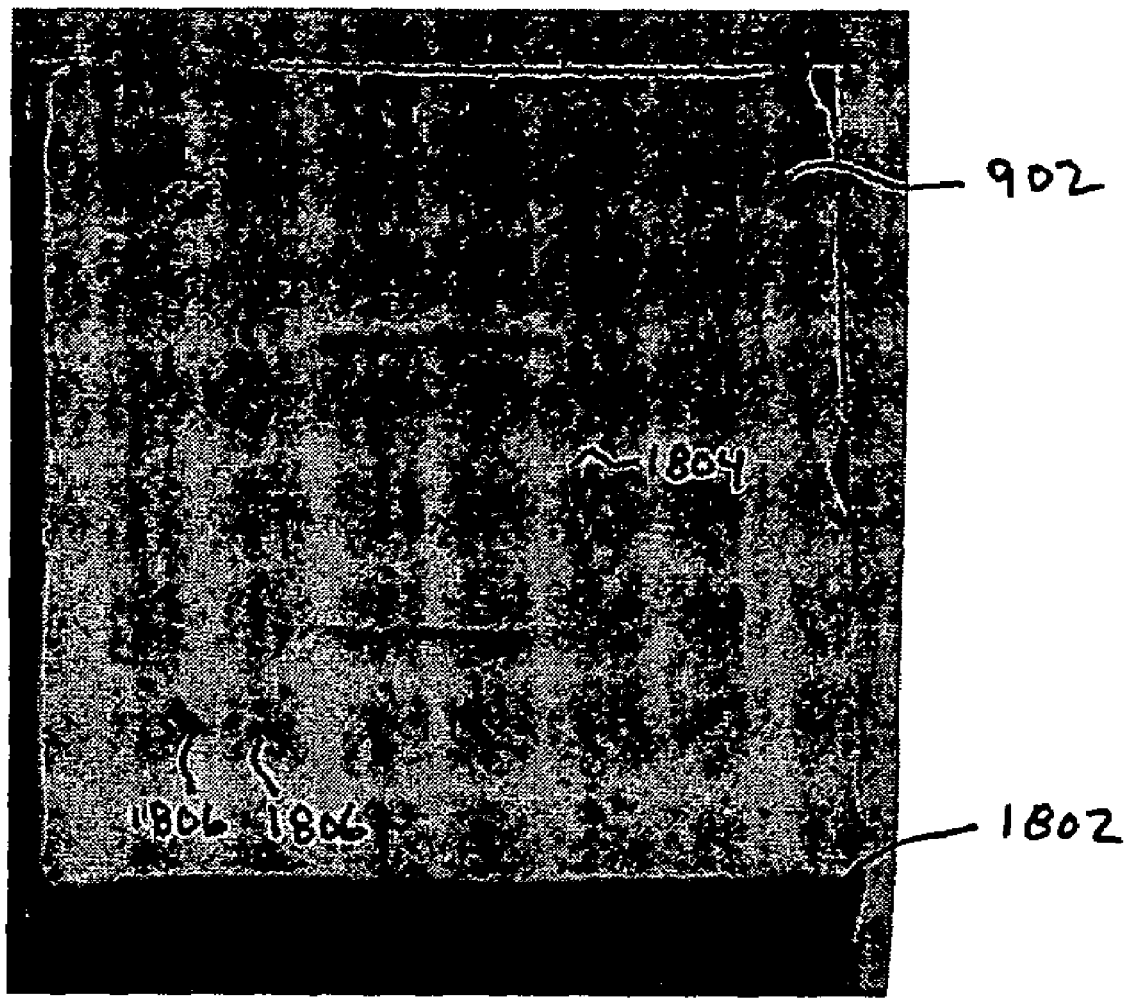
Figure 19:
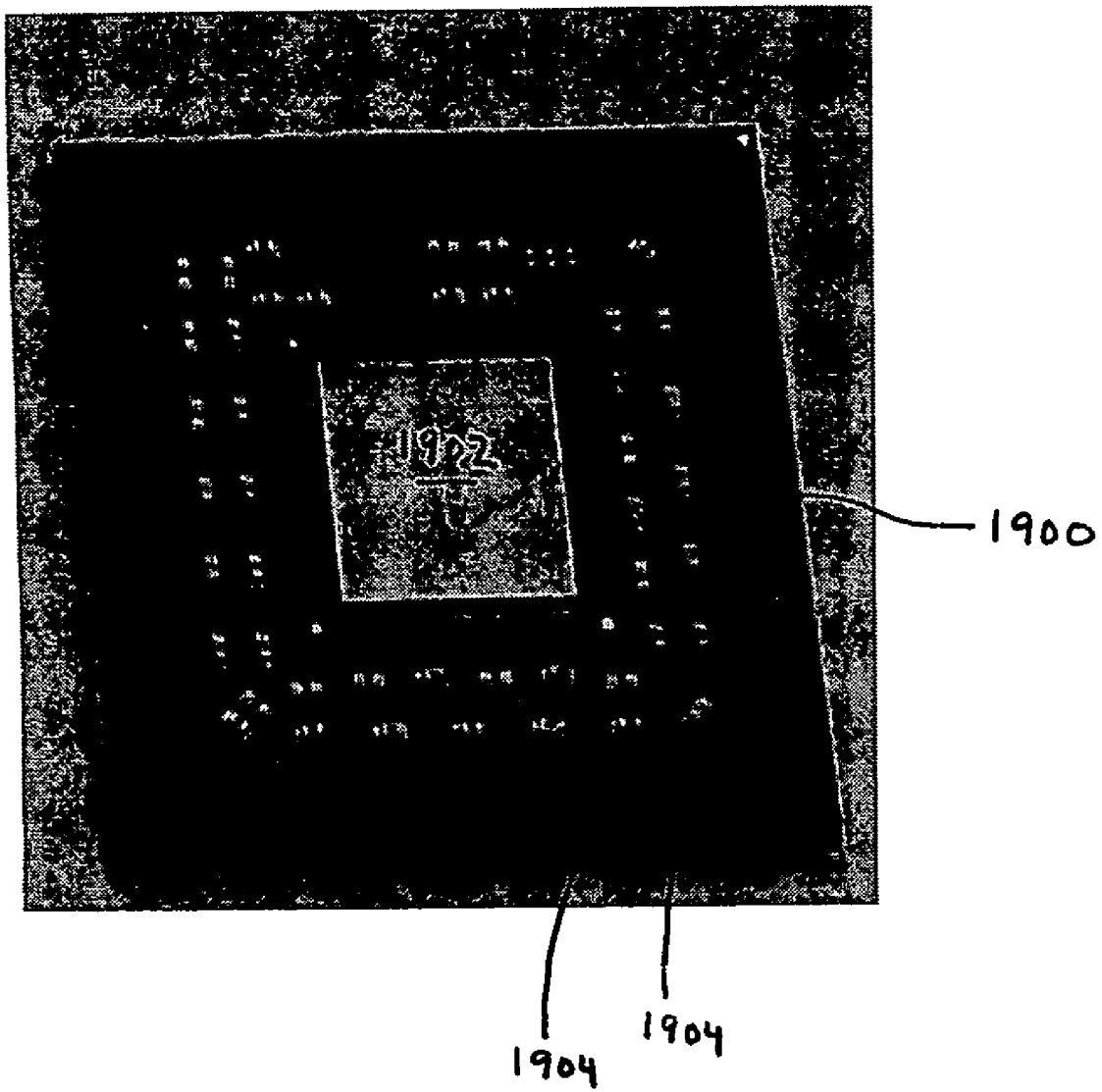

FIG. 18 shows adhesive material 902 having a central depression 1804 therein, formed on a heat sink 1802 to conform with a die 1902 of a package 1900 shown in FIG. 19. Furthermore, in FIG. 18, adhesive material 902 has surrounding cavities or depressions 1806 formed to conform with passive components 1904 of package 1900 of FIG. 19. Due to depressions 1804 and 1806, adhesive material 902 of FIG. 18 conforms with package 1900, when applied thereto. Depressions 1804 and 1806 can be formed prior to application of heat sink 1802 to package 1900, or during application thereto (by die 1902 and components 1904). While attaching heat sink 1802 to package 1900, pressure can be applied to deform adhesive material 902 be very thin, to provide enhanced thermal conductivity between heat sink 1802 and package 1900.

Adhesive material 902 can also be referred to as a thermal interface material (TIM). In an embodiment, the TIM has a thermal conductivity higher than 0.1 W/mK. The TIM is deformable such that both microscopic roughness in surface topography as well as macroscopic features (e.g., passive components, dies) protruding above the substrate top surface can be covered and filled by the TIM. The TIM functions as a potting material that fills the gap between a heat sink flat bottom surface and the top of a semiconductor device.

The TIM can be in the form of uncured silicone rubber. An advantage of using uncured silicone for heat sink attachment to IC devices is that the material has great deformability before curing. The gaps between the heat sink and surfaces of semiconductor devices are filled by the material before curing. The adhesive material fills the gaps, and takes the shape of the gaps. After curing, the adhesive material remains in the shape of the gaps, and holds the heat sink in place, providing both mechanical attachment to IC devices, and thermally conductive bridges between heat sinks and IC devices.

In an embodiment, a single piece of TIM can be used in the same manner as a thermally conductive tape for heat sink attachment to an IC package case. Furthermore, multiple, separate TIM pads with different thicknesses can be used. An advantage of this approach is that different thicknesses of TIM pads can accommodate variations in different IC device topographical features. For example, a flip chip BGA package has a substrate with a flip chip die attached to the central region of the substrate (e.g., FIG. 3). Passive components including capacitors, inductors, resistors can also be attached to the substrate surrounding the IC die (e.g., FIG. 9). Due to a difference in thickness between the IC die and the passive components, it is difficult to securely attach a heat sink to the flip chip package with a thermal tape that can not deform enough to fill the gaps due to differences of component height. A first type of TIM, and/or thickness for same, may be used for the IC die, while a second or additional types and/or thicknesses of TIM or adhesive materials, tapes, etc., can be used for the components surrounding the IC die.

Conventional B-stage polymer materials have thermal conductivity typically in the range of 0.2-0.7 W/mK. TC100U is a B-stage material that is a good thermal conductor (1.3 W/mK).

Thermal tapes are conventionally used to couple heat sinks to packages. Thermal tapes typically are pressure sensitive adhesives that are pressed to cause joining surfaces to adhere to each other. Thermal tapes can be pre-applied to surfaces, require relatively few steps, do not need to be cured, and can be applied in automated or manual fashions. However, thermal tapes do not deform substantially. Thus, they at best fill microscopic features in surfaces, but tend to leave gaps due to macroscopic features. For example, they tend to leave gaps next to dies and passive components, reducing thermal conductivity.

Thermal epoxies are also conventionally used to couple heat sinks to packages. Thermal epoxies are applied to surfaces, the surfaces are contacted, and the epoxies are thermally cured. Thermal epoxies provide good mechanical attachment strength. Furthermore, thermal epoxies flow to become thin and provide good thermal conductivity. However, thermal epoxies cannot be shaped well, as they tend to flow even after shaping, and can be messy to work with. Furthermore, expensive tools are required for accurate dispensing of thermal epoxies.

The adhesive material of the present invention provides advantages over thermal tapes and epoxies, as described elsewhere herein. Some of these include, flowing better than thermal tape, and thus being capable of being thinner and conforming to macroscopic shapes better than tape. The adhesive material of the present invention can be die cut/shaped to conform with target surfaces. Furthermore, the adhesive material can be more reliably and cleanly shaped than can thermal epoxies.

Embodiments of the present invention reduce the cost of heat sink mechanical attachment to integrated circuit packages. Stronger mechanical bonds between the external heat sink and package are provided by increasing an adhesion contact area between heat sink and IC device. An interface thermal resistance is reduced due to the increased contact area between the heat sink and the IC device surfaces. The requirement for integrated 2-piece or 1-piece heat spreader for integrated circuit packages is reduced or entirely removed by direct attachment of external heat sink to both a die surface and a substrate top surface.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for attaching a heat sink to an integrated circuit package, comprising:
  applying a deformable adhesive material to a surface of the integrated circuit package, wherein the adhesive material is thermally conductive;
  shaping the adhesive material prior to said applying the deformable adhesive material to the surface of the integrated circuit package;
  applying a surface of the heat sink to the surface of the integrated circuit package, wherein the shaped adhesive material is between the surface of the heat sink and the surface of the integrated circuit package; and curing the adhesive material to adhere the heat sink to the integrated circuit package, whereby the adhesive material provides a thermal path between the heat sink and the integrated circuit package.

2. The method of claim 1, wherein the surface of the integrated circuit package includes a surface of a substrate of the integrated circuit package, wherein said applying a surface of the heat sink to the surface of the integrated circuit package comprises:

applying the surface of the heat sink to the surface of the substrate.

3. The method of claim 1, wherein the adhesive material is a silicone material, wherein said applying the deformable adhesive material to surface of the integrated circuit package comprises:

applying the silicone material to the surface.

4. The method of claim 3, wherein the silicone material comprises a solid silicone rubber, wherein the solid silicone rubber provides enhanced electrical isolation between the heat sink and the integrated circuit package.

5. The method of claim 1, wherein the adhesive material is a paste, wherein said applying a deformable adhesive material to the surface of the integrated circuit comprises:

applying the adhesive material as a paste to the surface of the integrated circuit.

6. The method of claim 1, wherein the adhesive material is provided on a surface of a tape, wherein said applying a deformable adhesive material to the surface of the integrated circuit comprises:

transferring the adhesive material from the tape to the surface of the integrated circuit.

7. The method of claim 1, wherein the surface of the integrated circuit package is curved, wherein said applying the deformable adhesive material to the surface of the integrated circuit package comprises:

contacting the surface of the adhesive material to the curved surface of the integrated circuit package, wherein the adhesive material conforms to the curved surface.

8. The method of claim 7, wherein the curved surface of the integrated circuit package is a surface of an encapsulating material, wherein said contacting comprises:

contacting the surface of the adhesive material to the curved surface of the encapsulating material.

9. The method of claim 8, wherein a surface of an integrated circuit is exposed through the encapsulating material, wherein said contacting comprises:

contacting the surface of the adhesive material to the surface of the integrated circuit.

10. A method for attaching a heat sink to an integrated circuit package, comprising:

applying an adhesive material to a surface of the heat sink, wherein the adhesive material is thermally conductive;

shaping the adhesive material;

contacting a surface of the adhesive material to a surface of the integrated circuit package; and curing the adhesive material to adhere the surface of the heat sink to the surface of the integrated circuit package;

whereby the adhesive material provides a thermal path between the heat sink and the integrated circuit package.

11. A method for attaching a heat sink to an integrated circuit package, comprising:

applying a deformable adhesive material to a surface of the integrated circuit package, wherein the adhesive material is thermally conductive and wherein the surface of the integrated circuit package includes a surface of a substrate of the integrated circuit package;

shaping the adhesive material, comprising:

forming a depression in a surface of the adhesive material;

applying a surface of the heat sink to a surface of the integrated circuit package, wherein the shaped adhesive material is between the surface of the heat sink and the surface of the integrated circuit package, comprising:

applying the surface of the heat sink to the surface of the substrate; and curing the adhesive material to adhere the heat sink to the integrated circuit package, whereby the adhesive material provides a thermal path between the heat sink and the integrated circuit package.

12. The method of claim 11, wherein an integrated circuit (IC) die is mounted to the surface of the substrate, wherein said forming comprises:

forming the depression to accommodate the IC die.

13. The method of claim 11, wherein a passive component is mounted to the surface of the substrate, wherein said forming comprises:

forming the depression to accommodate the passive component.

14. The method of claim 10, wherein said shaping is performed prior to said applying the adhesive material to the surface of the heat sink.

15. The method of claim 10, wherein said shaping is performed after said applying the adhesive material to the surface of the heat sink.

* * * * *